United States Patent
Bae et al.

(10) Patent No.: US 9,529,565 B2
(45) Date of Patent: Dec. 27, 2016

(54) REMOTE CONTROL APPARATUS, METHOD AND MULTIMEDIA SYSTEM FOR VOLUME CONTROL

(71) Applicant: SAMSUNG ELECTRONICS CO., LTD., Suwon-si (KR)

(72) Inventors: Gun-young Bae, Yongin-si (KR); Ho-seon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 51 days.

(21) Appl. No.: 14/538,277

(22) Filed: Nov. 11, 2014

(65) Prior Publication Data

US 2015/0293744 A1  Oct. 15, 2015

(30) Foreign Application Priority Data

Apr. 11, 2014  (KR) .................. 10-2014-0043514

(51) Int. Cl.

| | | |
|---|---|---|
| *H03G 3/00* | (2006.01) | |
| *G06F 3/16* | (2006.01) | |
| *H04N 5/60* | (2006.01) | |
| *H04N 21/422* | (2011.01) | |
| *H04N 21/485* | (2011.01) | |
| *H04N 5/44* | (2011.01) | |
| *H03G 1/02* | (2006.01) | |
| *H03G 3/04* | (2006.01) | |
| *H03G 3/02* | (2006.01) | |
| *H03G 5/02* | (2006.01) | |

(52) U.S. Cl.
CPC ............... *G06F 3/165* (2013.01); *H03G 1/02* (2013.01); *H03G 3/04* (2013.01); *H04N 5/4403* (2013.01); *H04N 5/602* (2013.01); *H04N 21/42225* (2013.01); *H04N 21/4852* (2013.01); *H03G 3/02* (2013.01); *H03G 5/02* (2013.01); *H04R 2430/01* (2013.01)

(58) Field of Classification Search
CPC .............. H03G 1/02; H03G 3/04; H03G 5/02; H03G 3/02; H04N 5/602; H04N 21/4225; H04N 21/4852
USPC .................... 381/77, 79, 104–109
See application file for complete search history.

(56) References Cited

U.S. PATENT DOCUMENTS

| 5,579,496 | A  | * | 11/1996 | Van Steenbrugge ...... H05B 37/0254 340/12.31 |
|---|---|---|---|---|
| 6,396,549 | B1 | * | 5/2002 | Weber .................... H04B 1/202 340/12.22 |
| 8,447,048 | B2 | * | 5/2013 | Chen ....................... H04N 5/60 381/104 |
| 2007/0291955 | A1 | * | 12/2007 | Yamashita ............... H04R 5/00 381/79 |
| 2008/0075295 | A1 | * | 3/2008 | Mayman ............... G06F 1/1632 381/79 |
| 2012/0105724 | A1 | * | 5/2012 | Candelore ............ H04N 5/4403 348/569 |
| 2013/0094667 | A1 | * | 4/2013 | Millington ............ H04L 12/282 381/104 |

* cited by examiner

*Primary Examiner* — Disler Paul
(74) *Attorney, Agent, or Firm* — Sughrue Mion, PLLC

(57) ABSTRACT

Apparatuses, methods and systems are provided for controlling volume of a media system. A remote control is configured to control volume of a media unit and an external device simultaneously or consecutively.

17 Claims, 12 Drawing Sheets

FIG. 7
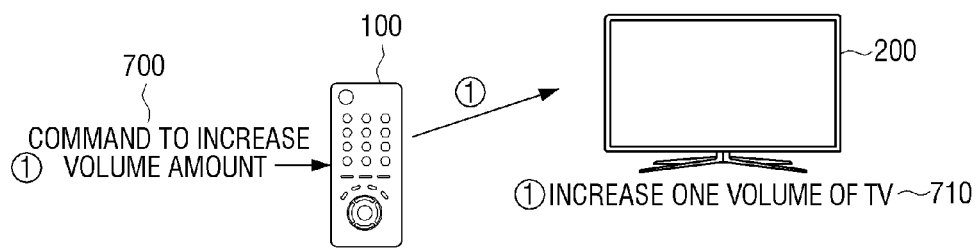
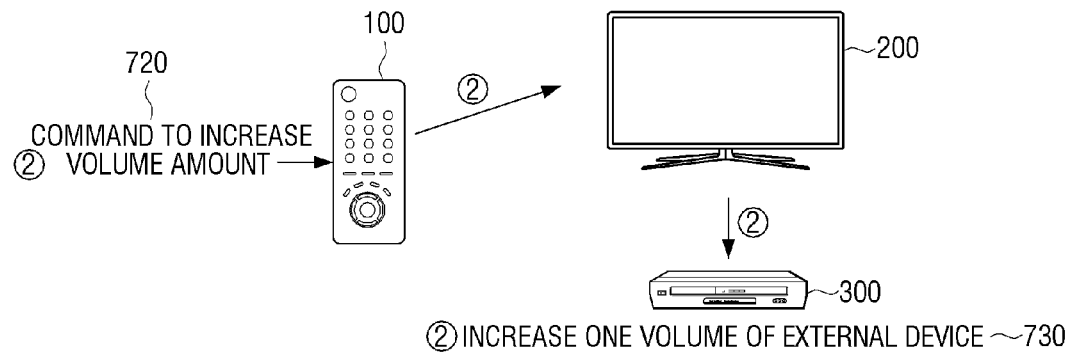
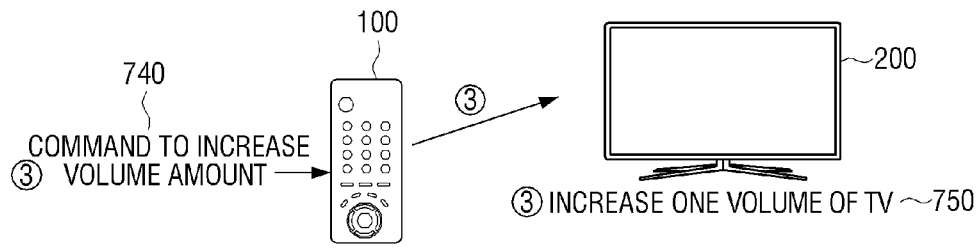
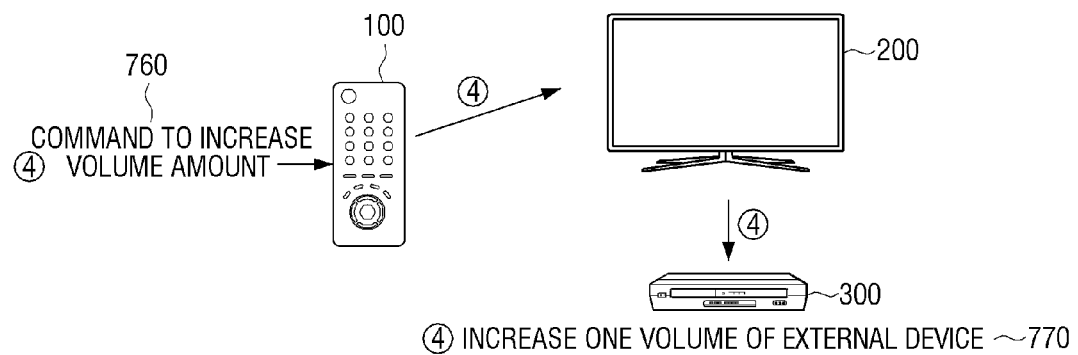

REMOTE CONTROL APPARATUS, METHOD AND MULTIMEDIA SYSTEM FOR VOLUME CONTROL

CROSS-REFERENCE TO RELATED APPLICATION

This application claims the benefit under 35 U.S.C. §119 (a) of Korean Patent Application No. 10-2014-0043514, filed in the Korean Intellectual Property Office on Apr. 11, 2014, the disclosure of which is incorporated herein by reference in its entirety.

BACKGROUND

1. Field

Apparatuses, methods and systems consistent with what is disclosed herein relate to volume control, and more specifically, to a remote control apparatus configured to transmit volume adjusting commands corresponding to user commands to a display apparatus and an external device interoperating with the display apparatus, and to control volume of the display apparatus and the external device simultaneously or alternately.

2. Description of Related Art

Strengthened by the development of electronic technologies, various types of electronic apparatuses have recently been developed. For example, various types of electronic apparatuses, including a display apparatus and an external device interoperating with the display apparatus, are used at home. Further, multi-function remote control apparatuses that can control various functions of electronic apparatuses are being developed.

When volume of a display apparatus and an external device interoperating with the display apparatus is adjusted, a user may adjust the volume by using two different remote control apparatuses. Even when the volume is adjusted by using a multi-function remote control apparatus, there is the inconvenience that the volume of the display apparatus and the external device must be adjusted by using different techniques with respect to the related multi-function remote control apparatus.

Further, when volume of an external device is adjusted by using a related multi-function remote control apparatus, a user may not obtain the requested volume even if he adjusts volume of an external device by using a remote control apparatus because the volume amount that a user hears is affected by the volume established in a display apparatus. For example, when volume of an external device is 10 and volume of a display apparatus is 0, a user may have a problem in which audio cannot be output due to the volume amount of a display apparatus even if he increases volume amount of an external device.

Thus, the related remote control apparatus may have limitations regarding controlling the volume of a display apparatus and an external device.

SUMMARY

Exemplary embodiments of the present disclosure may overcome the above disadvantages and other disadvantages not described above. Also, the present disclosure is not required to overcome the disadvantages described above, and an exemplary embodiment of the present inventive concept may not overcome any of the problems described above.

According to an aspect of an exemplary embodiment, a remote control apparatus is provided that can control volume of a display apparatus and an external device simultaneously or alternately.

According to another aspect of an exemplary embodiment, a volume control method of a remote control apparatus may include receiving a plurality of user commands to adjust volume, and alternately transmitting a plurality of volume adjusting commands, corresponding to the plurality of user commands, to a display apparatus and an external device.

Herein, the transmitting may include transmitting a first volume adjusting command, corresponding to a first one of the plurality of user commands, to a first one of the display apparatus and the external device, and transmitting a second volume adjusting command corresponding to a second one of the plurality of user commands, to a second one of the display apparatus and the external device.

Further, the volume control method may include, in response to each of the plurality of user commands to adjust volume, generating a volume adjusting command according to a type of device to which the volume adjusting command will be transmitted.

Further, the generating may generate a first volume adjusting command according to code information mapped with a first one of the display apparatus and the external device, in response to a first user command of the plurality of user commands, and a second volume adjusting command according to code information mapped with a second one of the display apparatus and the external device, in response to a second user command of the plurality of user commands.

According to an aspect of another exemplary embodiment, the remote control apparatus for controlling volume may include a communicator configured to communicate with a display apparatus and an external device, an input configured to receive a plurality of user commands to adjust volume, and a controller configured to control the communicator to alternately transmit a plurality of volume adjusting commands, corresponding to the plurality of user commands, to the display apparatus and the external device.

Herein, the communicator may communicate with the display apparatus and the external device according to a uniform communication method.

Further, the controller may control the communicator to transmit a first volume adjusting command corresponding to a first one of the plurality of user commands to a first one of the display apparatus and the external device, and to transmit a second volume adjusting command corresponding to a second one of the plurality of user commands to a second one of the display apparatus and the external device.

Further, the controller may, in response to each of the plurality of user commands, the controller generates a volume adjusting command according to a type of device to which the volume adjusting command will be transmitted.

Further, the controller may generate a first volume adjusting command according to code information mapped with a first one of the display apparatus and the external device in response to the first user command, and generates a second volume adjusting command according to code information mapped with a second one of the display apparatus and the external device in response to the second user command.

According to an aspect of another exemplary embodiment, the volume control method of a remote control apparatus may include receiving a user command to adjust volume, and simultaneously transmitting, in response to the receiving, volume adjusting commands to a display apparatus and an external device.

Further, the generating may generate a plurality of volume adjusting commands according to a type of device to which each of the plurality of volume adjusting commands will be transmitted.

Further, the generating may generate a first volume adjusting command according to code information mapped with the display apparatus and generates a second volume adjusting command according to code information mapped with the external device.

According to an aspect of another exemplary embodiment, the remote control apparatus for controlling volume may include a communicator configured to communicate with a display apparatus and an external device, an input configured to receive a user command to adjust volume, and a controller configured to control the communicator to simultaneously transmit volume adjusting commands corresponding to the user command to both a display apparatus and an external device.

Further, the communicator may communicate with the display apparatus and the external device according to a uniform communication method.

Further, the controller may, in response to a received user command, generate a first volume adjusting command according to code information mapped with the display apparatus, generate a second volume adjusting command according to code information mapped with the external device, and control the communicator to simultaneously transmit the first volume adjusting command to the display apparatus and the second volume adjusting command to the external device.

According to an aspect of another exemplary embodiment, the volume control method of the multimedia system may include transmitting, in response to a first user command to adjust volume, a first volume adjusting command to a display apparatus by a remote control apparatus, adjusting volume of the display apparatus in response to the first volume adjusting command, transmitting, in response to a second user command to adjust volume, a second volume adjusting command to the display apparatus by the remote control apparatus, transmitting the second volume adjusting command to an external device by the display apparatus, and adjusting volume of the external device in response to the second volume adjusting command.

According to an aspect of another exemplary embodiment, the multimedia system may include a remote control apparatus configured to receive a plurality of user commands to adjust volume, and a display apparatus configured to receive a first volume adjusting command, corresponding to a first one of the plurality of user commands to adjust volume, from the remote control apparatus, adjust volume in response to the first volume adjusting command, receive a second volume adjusting command, corresponding to a second one of the plurality of user commands to adjust volume, from the remote control apparatus, and transmit the second volume adjusting command to an external device, wherein the external device is configured to receive the second volume adjusting command from the display apparatus, and adjust volume in response to the second volume adjusting command.

According to an aspect of another exemplary embodiment, the volume control method of multimedia system may include transmitting, in response to a first user command to adjust volume, a first volume adjusting command to an external device by a remote control apparatus, adjusting volume of the external device in response to the first volume adjusting command, transmitting, in response to a second user command to adjust volume, a second volume adjusting command to the external device by the remote control apparatus, transmitting the second volume adjusting command to a display apparatus by the external device, and adjusting volume of the display apparatus in response to the second volume adjusting command.

According to an aspect of another exemplary embodiment, the multimedia system may include a remote control apparatus configured to receive a plurality of user commands to adjust volume, and an external device configured to receive a first volume adjusting command, corresponding to a first one of the plurality of user commands, from the remote control apparatus, adjust volume in response to the first volume adjusting command, receive a second volume adjusting command, corresponding to a second one of the plurality of user commands, from the remote control apparatus, and transmit the second volume adjusting command to a display apparatus, wherein the display apparatus is configured to receive the second volume adjusting command from the external device and adjust volume in response to the second volume adjusting command.

According to an aspect of another exemplary embodiment, the volume control method of the multimedia system may include generating, in response to a user command to adjust volume, a first volume adjusting command and a second volume adjusting command, simultaneously transmitting the first and the second volume adjusting commands to a display apparatus and an external device, and adjusting volume of the display apparatus in response to the first volume adjusting command, and adjusting volume by the external device in response to the second volume adjusting command.

According to an aspect of another exemplary embodiment, the multimedia system may include a remote control apparatus configured to generate first and second volume adjusting commands in response to a user command to adjust volume, and simultaneously transmit the first and second volume adjusting commands to a display apparatus and an external device, the display apparatus configured to receive the first volume adjusting command, and adjust volume in response to the first volume adjusting command, and the external device configured to receive the second volume adjusting command, and adjust volume in response to the second volume adjusting command.

According to an aspect of another exemplary embodiment, the volume adjusting method may include receiving a user input indicating a volume adjusting command, outputting at least one of a media unit volume adjusting command and an external device volume adjusting command in response to the user input, adjusting a media unit volume level in response to the media unit volume adjusting command, and adjusting an external device volume level in response to the external device volume adjusting command.

Further, the method may include outputting the media unit volume adjusting command and the external device volume adjusting command in an alternate manner, in response to successive volume adjusting commands.

Further, the method may include receiving, by the media unit, the external device volume adjusting command, and outputting, by the media unit, the external device volume adjusting command to the external device.

Further, the method may include receiving, by the external device, the media unit volume adjusting command, and outputting, by the external device, the media unit volume adjusting command to the media unit.

Further, the method may include outputting both the media unit volume adjusting command and the external device volume adjusting command simultaneously, in response to the volume adjusting command.

Further, the method may include receiving, by the media unit, the external device volume adjusting command, and outputting, by the media unit, the external device volume adjusting command to the external device.

Further, the method may include receiving, by the external device, the media unit volume adjusting command, and outputting, by the external device, the media unit volume adjusting command to the media unit.

According to the above embodiments, volume of the display apparatus and the external device can be adjusted simultaneously or consecutively by using one remote control apparatus.

BRIEF DESCRIPTION OF THE DRAWINGS

The above and/or other exemplary aspects and advantages of the present disclosure will be more apparent by describing certain exemplary embodiments of the present disclosure with reference to the accompanying drawings, in which:

FIGS. 7 and 8 illustrate exemplary operations of adjusting volume in the multimedia system according to an exemplary embodiment;

DETAILED DESCRIPTION

Figure 1:
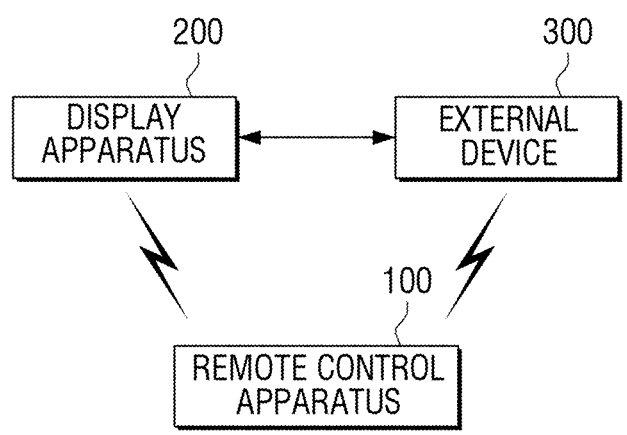
FIG. 1 illustrates a multimedia system according to an exemplary embodiment.

Certain exemplary embodiments will now be described in greater detail with reference to the accompanying drawings. Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

The following detailed description is provided to assist the reader in gaining a comprehensive understanding of the methods, apparatuses, and/or systems described herein. However, various changes, modifications, and equivalents of the methods, apparatuses and/or systems described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 1 illustrates a multimedia system according to an exemplary embodiment. Referring to FIG. 1, the multimedia system may include a remote control apparatus 100, a display apparatus 200 and an external device 300.

The remote control apparatus 100 may be configured to receive user input to control a volume of the display apparatus 200, and may be configured to transmit volume adjusting commands, corresponding to the user input, to the display apparatus 200. Further, the remote control apparatus 100 may be configured to receive user input to control a volume of the external device 300 interoperating with the display apparatus 200, and may be configured to transmit, to the external device 300, volume adjusting commands.

Herein, the remote control apparatus 100 may be configured to alternately or simultaneously transmit a first user command to control volume to the display apparatus 200 and a second user command to the external device 300.

In one exemplary embodiment, the display apparatus 200 may be a smart TV. In other exemplary embodiments, the display apparatus 200 may be a desktop PC, tablet PC, a smart phone, or the like as would be understood by one of ordinary skill in the art. The display apparatus 200 may be configured to receive information from the external device 300. The information may be broadcast content.

Further, the display apparatus 200 may be configured to receive both the first and second volume adjusting commands, adjust volume based on the volume adjusting commands received from the remote control apparatus 100, and transmit the received volume adjusting commands to the external device 300. Moreover, the apparatus in communication with the communicator 110 and the external device 300 is merely one example of an apparatus that is consistent with the present disclosure. The apparatus may be an audio only apparatus, such as a portion of a stereo system.

The external device 300 may support a plurality of operating modes in which video, audio, or video/audio information is provided to the display apparatus. The external device 300 may be implemented as an STB (Set Top Box), PC (Personal Computer), notebook, PMP (Portable Media Player), or DVD (Digital Video Disc) player.

Further, the external device 300 may also be configured to receive both the first and second volume adjusting commands, adjust volume based on volume adjusting commands, and transmit the received volume adjusting commands to the display apparatus 200.

Figure 2:
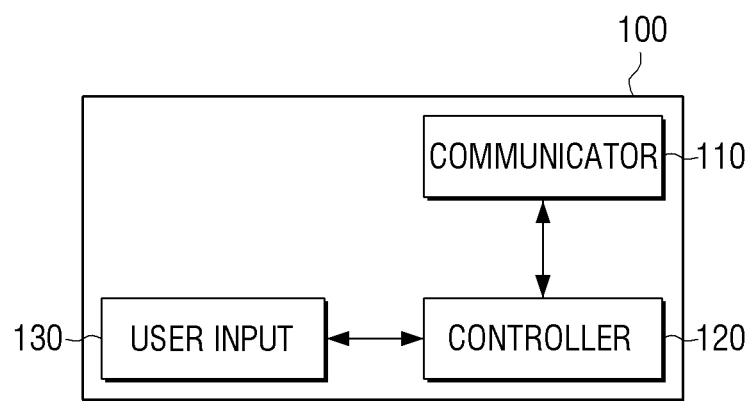
FIG. 2 is a detailed block diagram of a remote control apparatus according to an exemplary embodiment.
Figure 3:
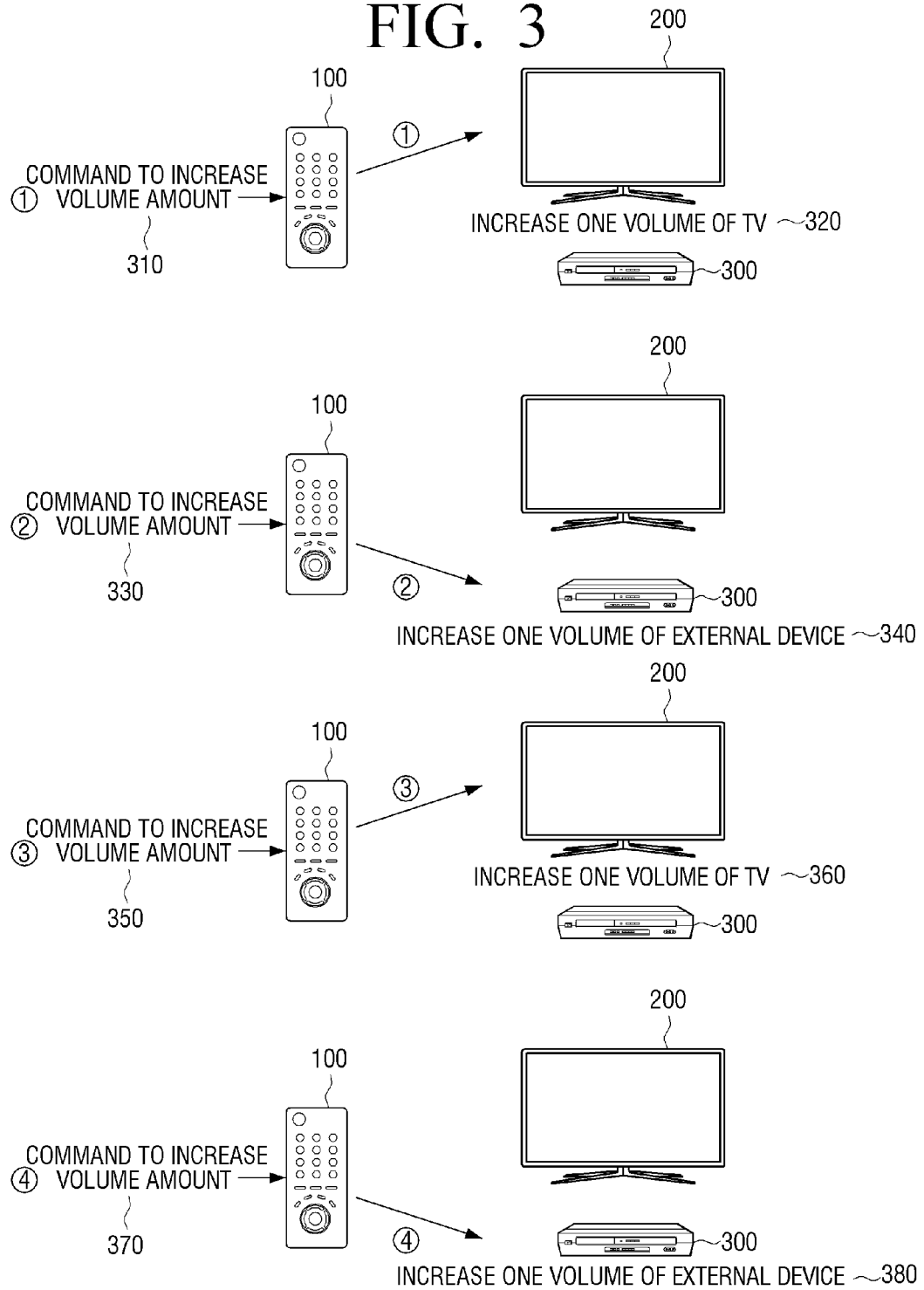
FIGS. 3 and 4 illustrate exemplary operations of the remote control apparatus to control volume of a display apparatus and an external device.
Figure 4:
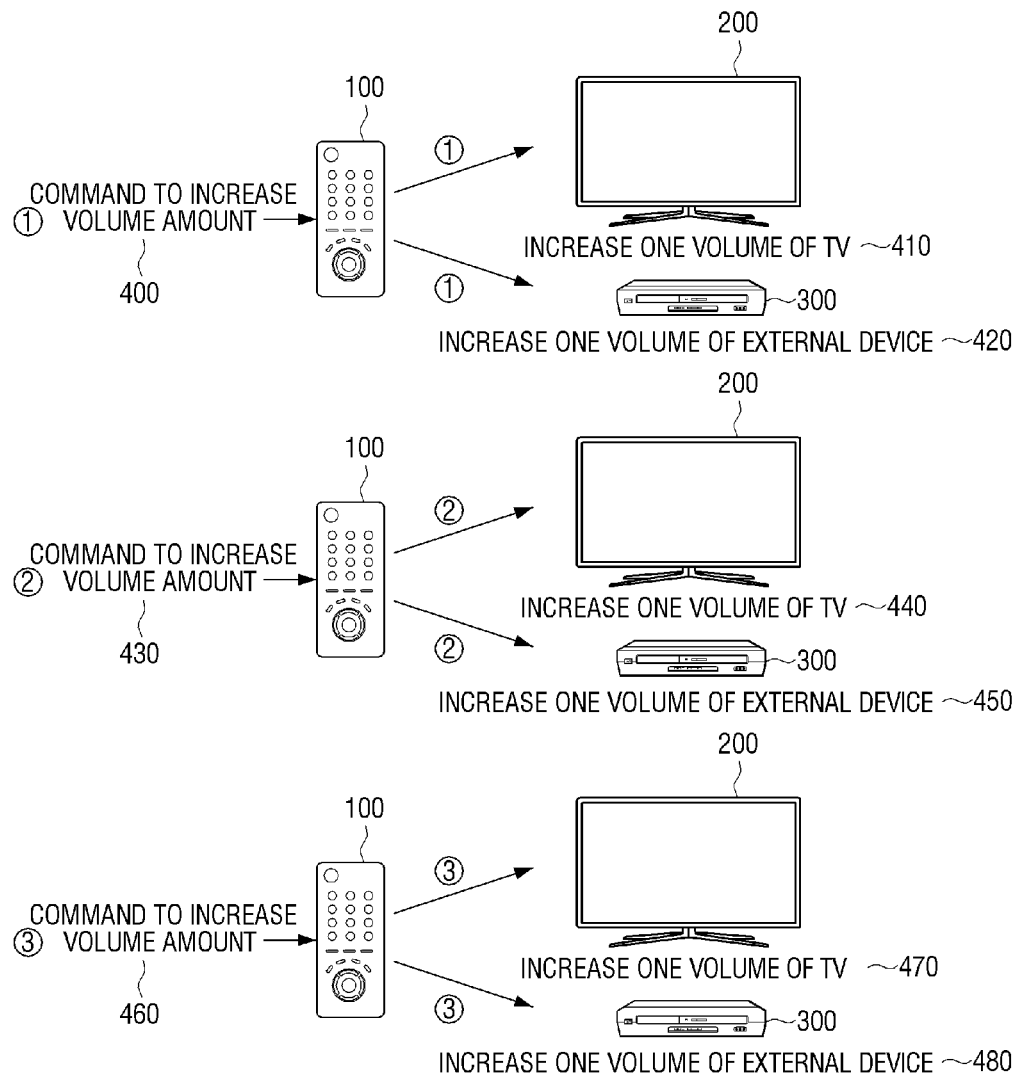

The following will explain the remote control apparatus 100 according to various exemplary embodiments by referring to FIGS. 2 to 4.

FIG. 2 is a diagram illustrating the remote control apparatus according to an exemplary embodiment.

Referring to FIG. 2, the remote control apparatus 100 may include a communicator 110, a controller 120, and a user input 130.

In the example of FIG. 2 an exemplary remote control apparatus 100 is illustrated to include user command transreceiving functions. For example, according to exemplary embodiments, some components of FIG. 2 may be deleted or modified. Furthermore, other components may be added. The communicator 110 may be configured to communicate with various external devices according to various communication methods. Specifically, the communicator 110 may be configured to transmit volume adjusting commands to the external display apparatus 200 or to the external device 300. For example, the communicator 110 may be configured to communicate with the display apparatus 200 and/or the external device 300 using an infrared ray communication method. In other exemplary embodiments, the communicator 110 may be configured to communicate with the display apparatus 200 and/or the external device 300 according to one of a plurality of various exemplary wireless communication technologies such as WiFi, Bluetooth, RF (Radio Frequency), IEEE 802.11, WLAN (Wireless Local Area Network), HR WPAN (High-Rate Wireless Personal Area Network), UWB (Ultra-Wide Band), LR WPAN (Low-Rate Wireless Personal Area Network), and IEEE 1394.

According to one example, the remote control apparatus 100 may be configured to communicate with both the display apparatus 200 and the broadcasting receiving device 300 according to the same communication method. In other exemplary embodiments the remote control apparatus 100 may be configured to communicate with the display apparatus 200 and the broadcasting receiving device 300 according to different communication methods. Specifically, the remote control apparatus 100 and the display apparatus 200 may be configured to communicate according to Bluetooth communication method, whereas the remote control apparatus 100 and the external device 300 may communicate according to an infrared ray communication method. Further, when the remote control apparatus 100 is implemented as a pointing remote control apparatus, it may be configured to communicate simultaneously using two different communication technologies.

Further, when user input is received by the remote control apparatus 100, the communicator 110 may be configured to transmit a plurality of volume adjusting commands corresponding to a plurality of user commands, or to transmit a volume adjusting command corresponding to a user command to the display apparatus 200 in conjunction with a user command to the external device 300. The user input 130 is configured to receive various user commands to control both the external display apparatus 200 and the external device 300. Specifically, the user input 130 may be configured to receive user commands to adjust volume of both the display apparatus 200 and the external device 300.

In one example, the user input 130 may be implemented as one or more buttons. In another example, the user input 13 may be implemented as a touch screen or other input device as would be understood by one of ordinary skill in the art.

The controller 120 may be configured to control both the display apparatus 200 and the external device 300.

Specifically, the controller 120 may be configured to control the display apparatus 200 and the external device 300 by controlling the communicator 110 to transmit user commands inputted through the user input 130 to both the display apparatus 200 and the external device 300.

Specifically, when a plurality of user commands to adjust volume are input through the user input 130, the controller 120 may be configured to control the communicator 110 to alternately transmit a plurality of volume adjusting commands corresponding to the plurality of user commands to both the display apparatus 200 and the external device 300.

Specifically, when a first user command to adjust volume is input, the controller 120 may be configured to control the communicator 110 to transmit a first volume adjusting command corresponding to the first user command to one of the display apparatus 200 and the external device 300. Further, when a second user command to adjust volume is input, the controller 120 may be configured to control the communicator 110 to transmit a second volume adjusting command corresponding to the other of the display apparatus 200 and the external device 300.

Herein, when a user command to adjust volume is received, the controller 120 may be configured to generate different volume adjusting commands according to various types of devices to which the volume adjusting commands will be transmitted. Specifically, when the first user command is input, the controller 120 may be configured to generate a first volume adjusting command according to code information mapped with one of the display apparatus 200 and the external device 300. When the second user command is input, the controller 120 may be configured to generate a second volume adjusting command according to code information mapped with the other of the display apparatus 200 and the external device 300.

According to an exemplary embodiment illustrated in FIG. 3, when the display apparatus 200 has an initial volume setting of 10, and the external device 300 has an initial volume setting of 5, if a user inputs a first command to increase the volume amount 310 by using a volume increasing button provided in the user input 130 of the remote control apparatus 100, the controller 120 may be configured to generate a command to increase the volume amount according to code information mapped with the display apparatus 200. In this process, the controller 120 may control the communicator 110 to transmit the command to increase the volume amount to the display apparatus 200. In response to the command to increase the volume amount, the display apparatus 200 may increase the volume from 10 to 11.

When a user inputs a second command to increase the volume amount 330 by using the volume increasing button provided in the user input 130 of the remote control apparatus 100, the controller 120 may be configured to generate a command to increase the volume amount according to code information mapped with the external device 300. In this process, the controller 120 may control the communicator 110 to transmit the command to increase the volume amount to the external device 300 in response to the second user command. In response to the command to increase the volume amount, the external device 300 may increase the volume from 5 to 6.

Further, when a user inputs a third command to increase the volume amount 350 by using the volume increasing button provided in the user input 130 of the remote control apparatus 100, the controller 120 may be configured to generate a command to increase the volume amount according to code information mapped with the display apparatus 200. In this process, the controller 120 may control the communicator 110 to transmit the command to increase one volume amount to the display apparatus 200. When the command to increase one volume amount is received, the display apparatus 200 may increase the volume from 11 to 12.

When a user inputs a fourth command to increase the volume amount 370 by using the volume increasing button provided in the user input 130 of the remote control apparatus 100, the controller 120 may be configured to generate a command to increase the volume amount according to code information mapped with the external device 300. In this process, the controller 120 may control the communicator 110 to transmit the command to increase one volume amount to the external device 300. When the command to increase one volume amount is received, the external device 300 may increase the volume from 6 to 7.

As described above, the controller 120, according to an exemplary embodiment, may be configured to alternately control volume of the display apparatus 200 and the external device 300 by controlling the communicator 110 to alternately transmit volume increasing commands to the display apparatus 200 and the external device 300 in response to user input indicating an increase of volume.

According to the above description, the controller 120 transmits a command to increase the volume amount corresponding to the first volume adjusting command to the display apparatus 200 when a user inputs a first command to increase the volume amount. Alternately, the command to increase the volume amount corresponding to the first volume adjusting command may be transmitted to the external device 300.

According to another exemplary embodiment illustrated in FIG. 4, the controller 120 may be configured to control the communicator 110 to simultaneously transmit volume adjusting commands corresponding to user input to both the display apparatus 200 and the external device 300.

In response to a user command to adjust volume, the controller 120 may be configured to generate different volume adjusting commands to be output to different types of devices to which the volume adjusting commands will be transmitted. Specifically, when a user command is input, the controller 120 may be configured to simultaneously generate a first volume adjusting command according to code information mapped with the display apparatus and a second volume adjusting command according to code information mapped with the external device.

Specifically, when the display apparatus 200 has an initial volume setting of 10, and the external device 300 has an initial volume setting of 5, if a user inputs a first command to increase the volume amount 400 by using the volume increasing button, the controller 120 may generate a command to simultaneously increase the volume level in both the display apparatus 200 and the external device 300 by one volume amount. In response to the command to simultaneously increase volume levels, the controller 120 may control the communicator 110 to simultaneously transmit the first volume adjusting command and the second volume adjusting command to the display apparatus 200 and the external device 300, respectively. The display apparatus 200 may receive the first command to increase the volume amount and increase volume from 10 to 11. Simultaneously, the external device 300 may receive the command to increase the volume amount and increase volume from 5 to 6.

When a user inputs a second command to increase the volume amount 430, the controller 120 may again generate a command to control the communicator 110 to simultaneously transmit the first volume adjusting command and the second volume adjusting command to the display apparatus 200 and the external device 300, respectively. The display apparatus 200 may be configured to increase volume from 11 to 12, and the external device 300 may be configured to increase volume from 6 to 7 when the command to increase the volume amount is received.

When a user inputs a third command to increase the volume amount 460, the controller 120 may be configured to generate a command to control the communicator 110 to simultaneously transmit the first volume adjusting command and the second volume adjusting command to the display apparatus 200 and the external device 300, respectively. The display apparatus 200 may be configured to increase volume from 12 to 13, and the external device 300 may be configured to increase volume from 7 to 8 when the command to increase the volume amount is received.

As described above, with one single user input, the controller 120 may be configured to simultaneously generate the first user command and the second user command by using the uniform volume increasing button provided in the user input 130 of the remote control apparatus 100 to control the communicator 110 to simultaneously transmit the volume increasing command corresponding to the first user command and the second user command to the display apparatus 200 and the external device 300. Thus, volume of the display apparatus 200 and the broadcasting receiving device 300 can be simultaneously controlled with one user command.

Figure 5:
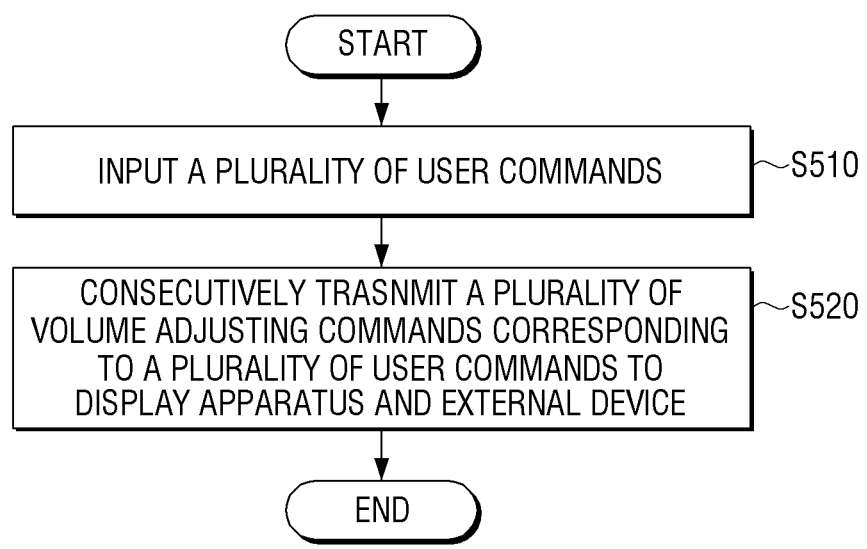
FIGS. 5 and 6 are flowcharts provided to explain exemplary operations of the remote control apparatus to control volume of a display apparatus and an external device.
Figure 6:
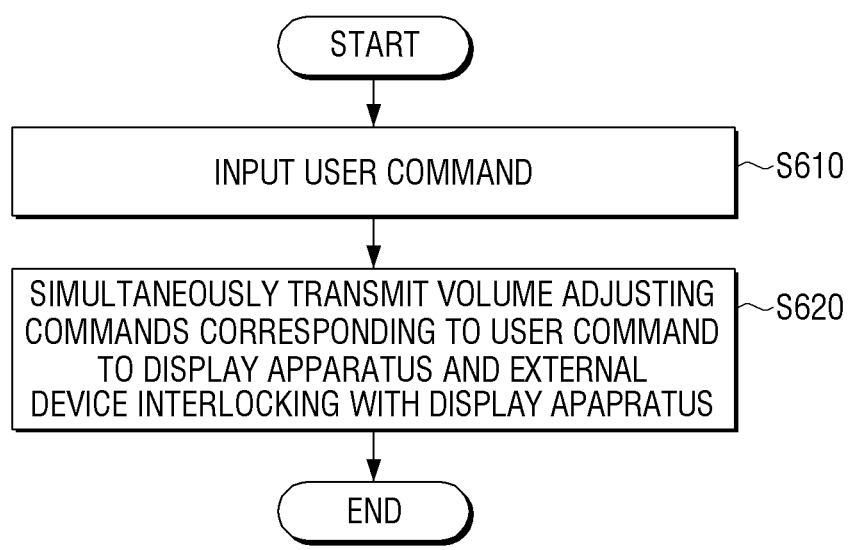

FIGS. 5 and 6 are flowcharts provided to explain exemplary operation of the remote control apparatus.

In one exemplary embodiment illustrated in FIG. 5, the remote control apparatus 100 receives a plurality of user commands at S510. At S520, the remote control apparatus 100 may control the communicator 110, in response to a plurality of user inputs, to alternately transmit a plurality of volume adjusting commands in an alternating manner to the display apparatus 200 and the external device 300. Specifically, when a first user command to adjust volume is input, the remote control apparatus 100 may transmit a first volume adjusting command corresponding to either the display apparatus 200 or the external device 300. When a second user command to adjust volume is input, the remote control apparatus 100 may transmit a second volume adjusting command to the other of the display apparatus 200 and the external device 300. Herein, the remote control apparatus 100 may generate different volume adjusting commands according to the type of device to which the particular volume adjusting command will be transmitted.

According to another exemplary embodiment illustrated in FIG. 6, the remote control apparatus 100, in response to a user input, may simultaneously transmit volume adjusting commands to the display apparatus 200 and the external device 300. Specifically, when a user command is input, the remote control apparatus 100 may generate a first volume adjusting command according to code information mapped with the display apparatus 200, and generate a second volume adjusting command according to code information mapped with the external device 300. Further, the remote control apparatus 100 may transmit the generated first and second volume adjusting commands to the display apparatus 200 and the external device 300, respectively.

It should be appreciated that the above described exemplary embodiments are not meant to be limiting. In other embodiments the remote control apparatus 100 may transmit the first and the second volume adjusting commands to one of the display apparatus 200 and the external device 300. The one of the display apparatus 200 and the external device 300 that receives the first and second volume adjusting command may adjust its volume and transmit the second or first volume adjusting command to the other device to adjust volume. This will be specifically explained below.

According to another exemplary embodiment illustrated in FIGS. 7-10, the remote control apparatus 100 transmits first and second volume adjusting commands to one of the display apparatus 200 and the external device 300.

When a first user command to adjust volume is input, the remote control apparatus 100 may transmit a first volume adjusting command corresponding to the first user command to the display apparatus 200. Further, the display apparatus 200 may adjust its volume of the display apparatus 200 in response to the first volume adjusting command.

When a second user command to adjust volume is input, the remote control apparatus 100 may transmit a second volume adjusting command corresponding to the second user command to the display apparatus 200. The display apparatus 200 may transmit the second volume adjusting command to the external device 300. When the second volume adjusting command is received, the external device 300 may adjust volume in response to the second volume adjusting command.

Specifically, as illustrated in FIG. 7, when a user inputs a first command to increase the volume amount 700 by using the volume increasing button provided in the user input 130 of the remote control apparatus 100, the remote control apparatus 100 may generate a command to increase the volume amount and transmit the first volume adjusting command to the display apparatus 200. The display apparatus 200 may receive the first volume adjusting command to increase the volume amount and increase its volume from 10 to 11.

When a user inputs a second command to increase volume amount 720 by using the volume increasing button provided in the user input 130 of the remote control apparatus 100, the remote control apparatus 100 may generate a second volume adjusting command to increase the volume amount and transmit the second volume adjusting command to the display apparatus 200. Herein, the display apparatus 200 may transmit the received second command to increase the volume amount to the external device 300. When the command to increase the volume amount is received, the external device 300 may increase its volume from 5 to 6.

Next, when a user inputs a third command to increase volume amount 740 by using the volume increasing button provided in the user input 130 of the remote control apparatus 100, the remote control apparatus 100 may generate a third command to increase the volume amount according to code information mapped with the display apparatus 200, and transmit the third command to the display apparatus 200. When the command to increase the volume amount is received, the display apparatus 200 may increase its volume from 11 to 12.

When a user inputs a fourth command to increase the volume amount 760 by using the volume increasing button provided in the user input 130 of the remote control apparatus 100, the remote control apparatus 100 may generate a fourth command to increase the volume amount according to code information mapped with the external device 300, and transmit the fourth command to the display apparatus 200. Herein, the display apparatus 200 may transmit the received fourth command to increase the volume amount to the external device 300. When the command to increase the volume amount is received, the external device 300 may increase its volume from 6 to 7.

Figure 8:
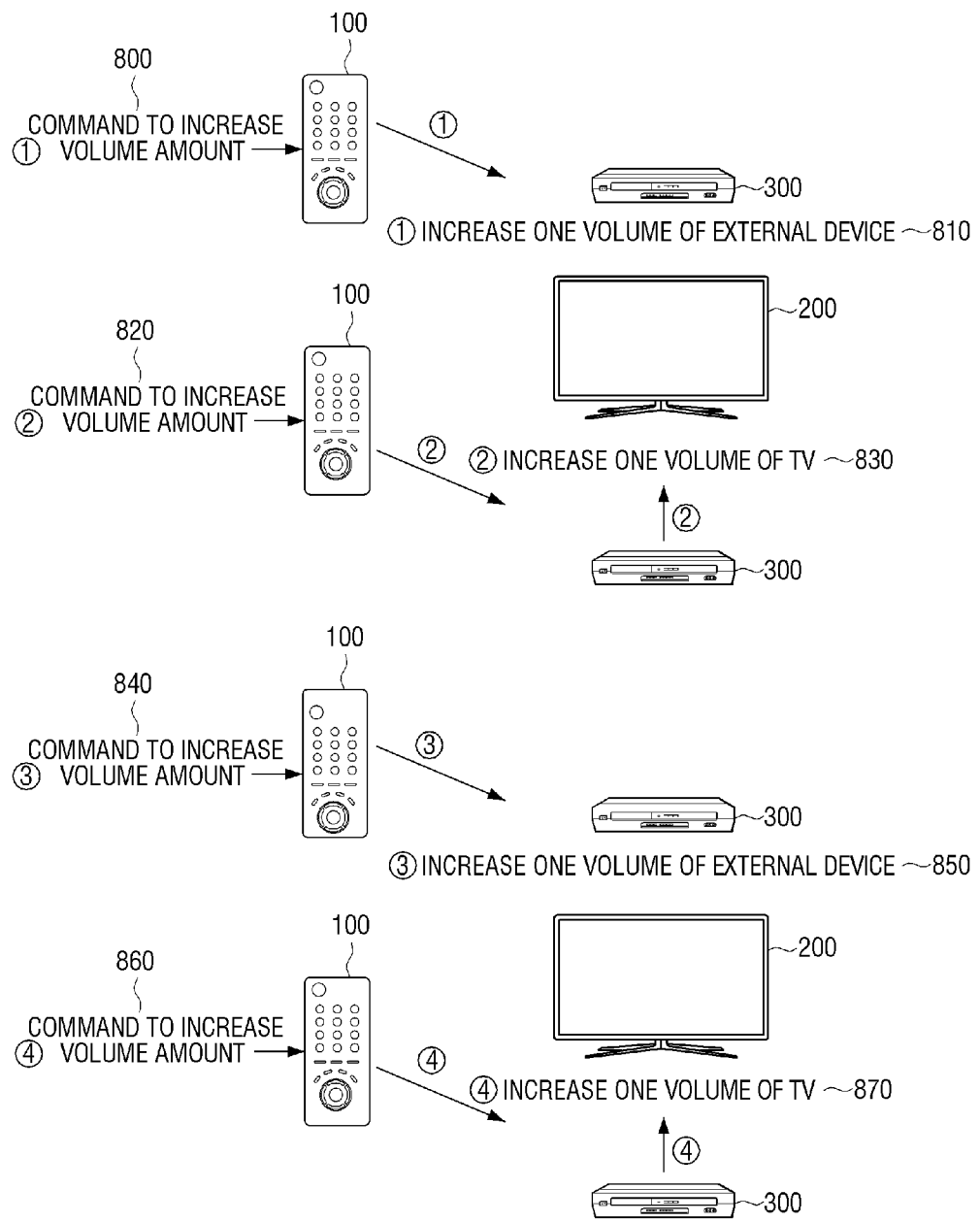

According to another exemplary embodiment illustrated in FIG. 8, when a user inputs a first command to increase the volume amount 800 by using the volume increasing button provided in the user input 130 of the remote control apparatus 100, the remote control apparatus 100 may generate a first command to increase the volume amount and transmit the first command to the external device 300. When the command to increase the volume amount is received, the external device 300 may increase its volume from 5 to 6.

When a user inputs a second command to increase the volume amount 820 by using the volume increasing button provided in the user input 130 of the remote control apparatus 100, the remote control apparatus 100 may generate a second command to increase the volume amount and transmit the second command to the external device 300. Herein, the external device 300 may transmit the received second command to increase the volume amount to the display apparatus 200. When the command to increase the volume amount is received, the display apparatus 200 may increase its volume from 10 to 11.

When a user inputs a third command to increase the volume amount 840 by using the volume increasing button provided in the user input 130 of the remote control apparatus 100, the remote control apparatus 100 may generate a third command to increase the volume amount according to code information mapped with the external device 300, and transmit the third command to the external device 300. When the command to increase the volume amount is received, the external device 300 may increase its volume from 6 to 7.

When a user inputs a fourth command to increase the volume amount 860 by using the volume increasing button provided in the user input 130 of the remote control apparatus 100, the remote control apparatus 100 may generate a fourth command to increase one volume amount according to code information mapped with the display apparatus 200, and transmit the fourth command to the external device 300. The external device 300 may transmit the received fourth command to increase the volume amount to the display apparatus 200. When the command to increase the volume amount is received, the display apparatus 200 may increase its volume from 11 to 12.

Figure 9:
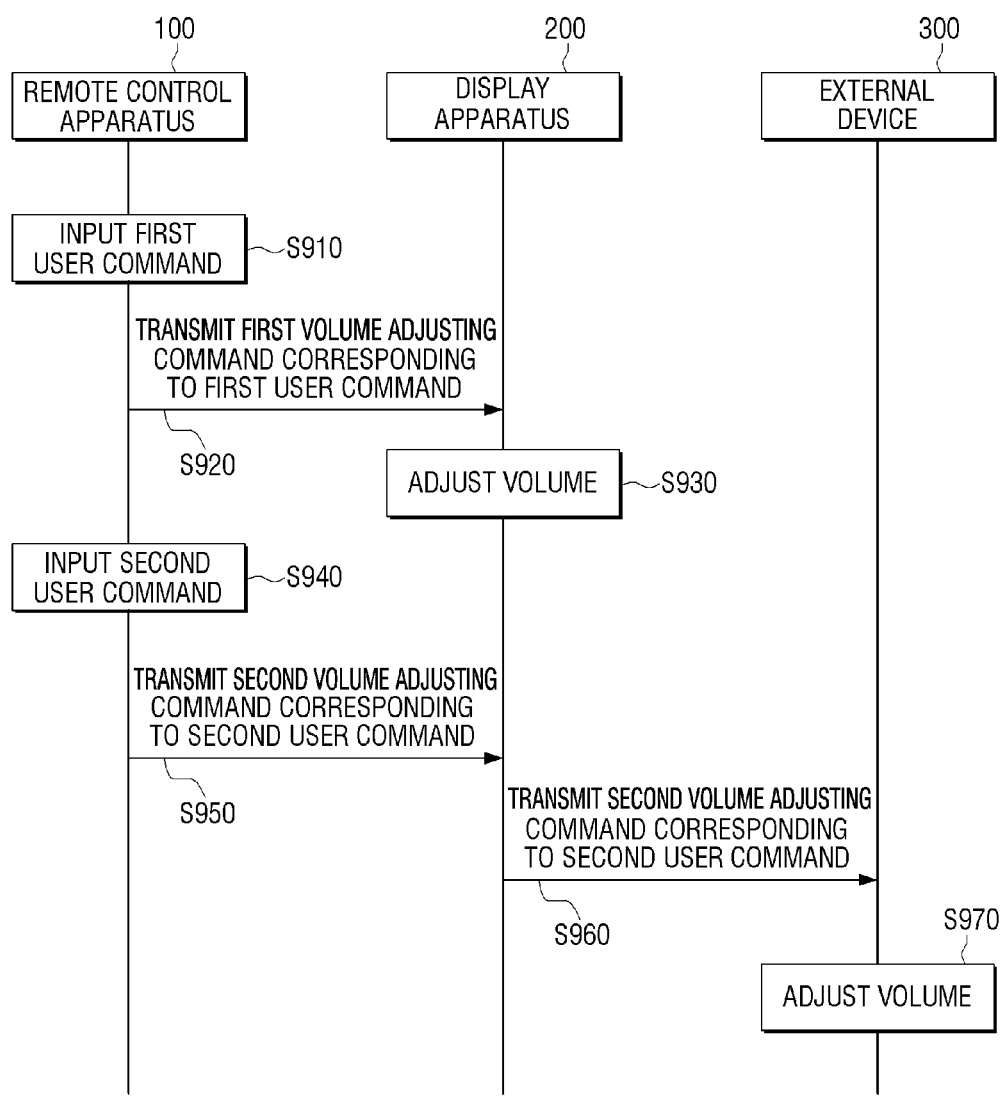
FIGS. 9 to 11 are sequence diagrams explaining operations of adjusting volume in the multimedia system according to an exemplary embodiment.

FIG. 9 is a sequence diagram illustrating volume adjusting operations of the multimedia system according to an exemplary embodiment. Referring to FIG. 9, the remote control apparatus 100 receives a first user command at S910. At S920, the remote control apparatus 100 may control the communicator 110 to transmit a first volume adjusting command, corresponding to the first user command, to the display apparatus 200. At S930, the display apparatus 200 receives the first volume adjusting command and adjusts volume.

At S940, the remote control apparatus 100 receives a second user command. At S950, the remote control apparatus 100 may control the communicator 110 to transmit a second volume adjusting command, corresponding to the second user command, to the display apparatus 200. The display apparatus 200 transmits the second volume adjusting command, corresponding to the second user command, to the external device 300 at S960, and the external device 300 adjusts volume at S970.

Figure 10:
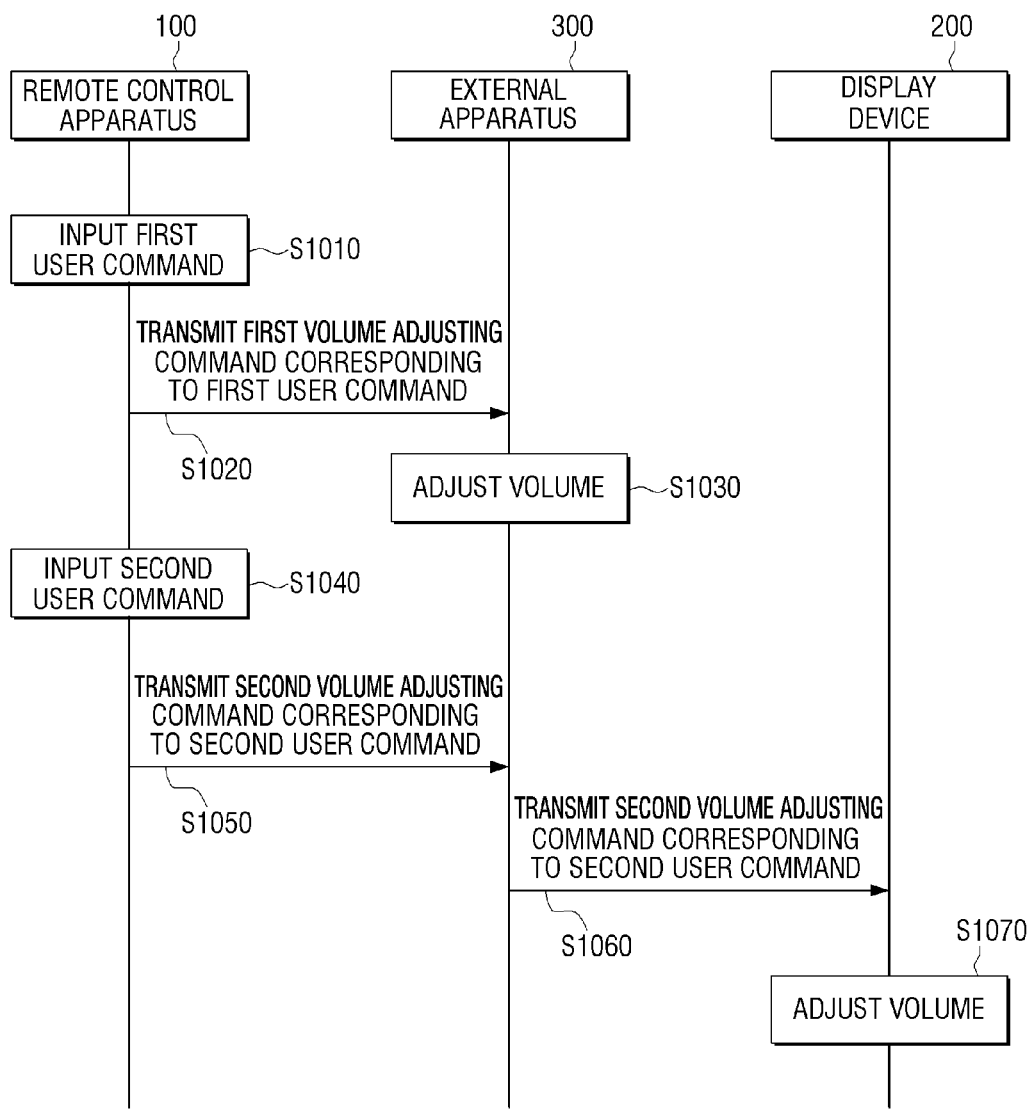

FIG. 10 is a sequence diagram illustrating volume adjusting operations of the multimedia system according to an exemplary embodiment. Referring to FIG. 10, the remote control apparatus 100 receives a first user command at S1010. At S1020, the remote control apparatus 100 may control the communicator 110 to transmit a first volume adjusting command, corresponding to the first user command, to the external device 300. At S1030, the external device 300 receives the first volume adjusting command and adjusts volume.

At S1040, the remote control apparatus 100 receives a second user command. At S1050, the remote control apparatus 100 may control the communicator 110 to transmit a second volume adjusting command, corresponding to the second user command, to the external device 300. The external device 300 may transmit the second volume adjusting command, corresponding to the second user command, to the display apparatus 200 at S1060, and the display apparatus 200 may adjust volume at S1070. As described above, the controller 120 according to an embodiment may adjust volume of the display apparatus 200 and the external device by transmitting a plurality of volume adjusting commands, corresponding to user commands, to one of the display apparatus 200 and the external device 300.

Figure 11:
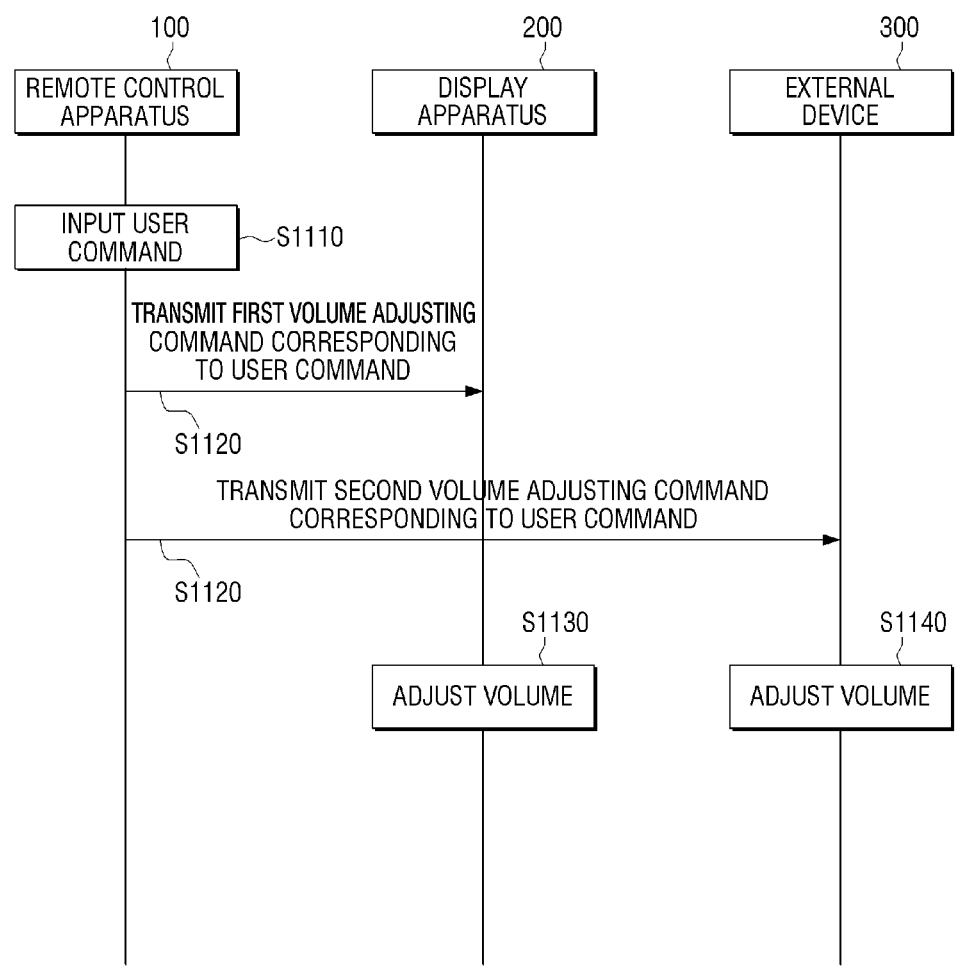

FIG. 11 is a sequence diagram describing volume adjusting operations of the multimedia system according to an exemplary embodiment. Referring to FIG. 11, the remote control apparatus 100 receives a user command at S1110. At S1120, the remote control apparatus 100 may generate first and second volume adjusting commands corresponding to the user command, and control the communicator 110 to simultaneously transmit the commands to the display apparatus 200 and the external device 300. At S1130, the display apparatus 200 receives the first volume adjusting command and adjusts its volume. Simultaneously, the external device 300 receives the second volume adjusting command and adjusts volume at S1140.

Figure 12:
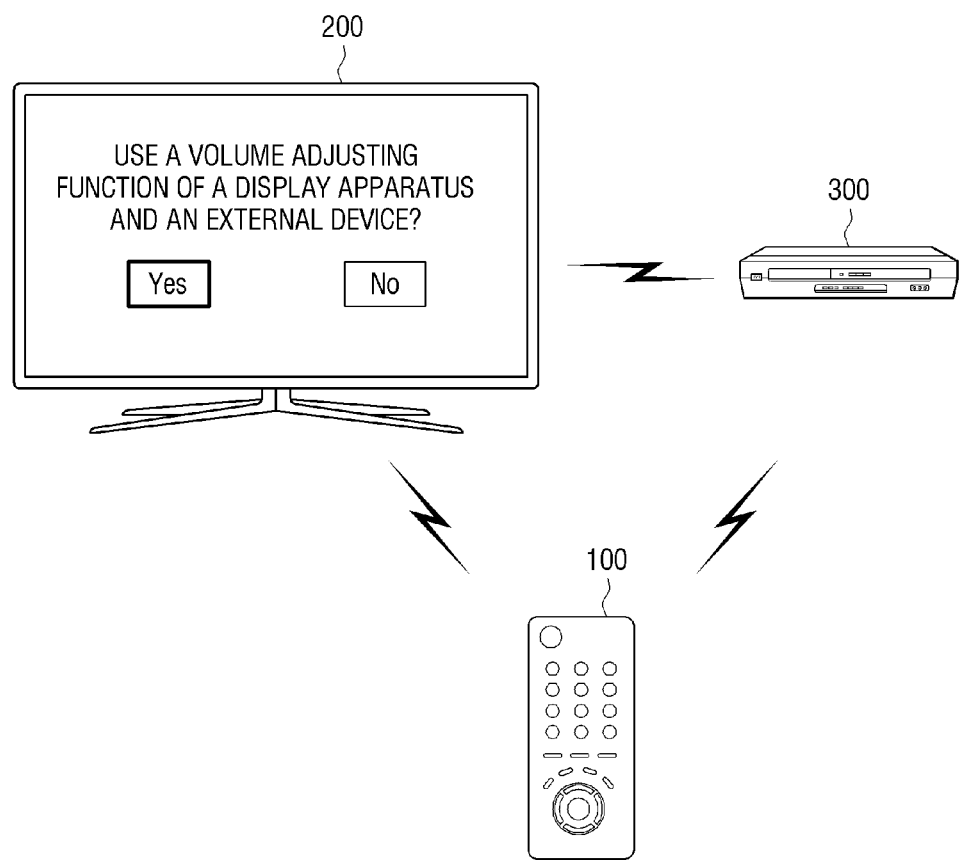
FIG. 12 is a diagram explaining operations of displaying an on-screen display (OSD) regarding whether to use a volume adjusting function on a screen of a display apparatus according to an exemplary embodiment.

FIG. 12 illustrates an on-screen display (OSD) displaying a selection of whether to use a volume adjusting function on a display screen.

According to an exemplary embodiment, as illustrated in FIG. 12, the display apparatus 200 may display an on-screen display to allow a user to select whether to use the volume adjusting function of the display apparatus 200 and the external device 300 using one remote control apparatus 100. In response to the display apparatus 200 displaying an on-screen display asking "Use the volume adjusting function of the display apparatus and the external device?" and a user selecting "YES," the display apparatus 200 may be modified into a mode that can receive user commands to control the display apparatus 200 and the external device 300 by using one remote control apparatus 100. In response to a user command, the remote control apparatus 100 may generate first and second volume adjusting commands, and control the communicator 110 to transmit the volume adjusting commands to the display apparatus 200 and the external device 300 alternately or simultaneously.

Program codes implementing the volume control method of the display apparatus according to the above various embodiments may be stored in a non-transitory computer readable recording medium. For example, the above various applications or programs may be stored and provided in non-transitory computer readable recording medium such as CD (Compact Disc), DVD (Digital Video Disc), hard disk, Blu-ray disk, USB (Universal Serial Bus), memory card, or ROM (Read Only Memory).

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A volume control method of a remote control apparatus, the method comprising:
receiving a plurality of user commands to adjust volume;
in response to each of the plurality of user commands being received, generating a plurality of different volume adjusting commands according to information mapped with a type of device to which a volume adjusting command among the plurality of different volume adjusting commands will be transmitted; and
alternately transmitting the plurality of different volume adjusting commands, to each of a display apparatus and an external device.

2. The volume control method of claim 1, wherein the alternately transmitting comprises:
transmitting a first volume adjusting command, corresponding to a first one of the plurality of user commands, to a first one of the display apparatus and the external device; and
transmitting a second volume adjusting command corresponding to a second one of the plurality of user commands, to a second one of the display apparatus and the external device.

3. The volume control method of claim 1, wherein the generating the plurality of different volume adjusting commands further comprises:
generating a first volume adjusting command according to code information mapped with a first one of the display apparatus and the external device, in response to a first user command of the plurality of user commands; and
generating a second volume adjusting command according to code information mapped with a second one of the display apparatus and the external device, in response to a second user command of the plurality of user commands.

4. A remote control apparatus for controlling volume, comprising:
a communicator configured to communicate with a display apparatus and an external device;
an input configured to receive a plurality of user commands to adjust volume; and
a controller configured to, in response to each of the plurality of user commands being received, generate a plurality of different volume adjusting commands according to information mapped with a type of device to which a volume adjusting command among the plurality of different volume adjusting commands will be transmitted, and control the communicator to alternately transmit the plurality of different volume adjusting commands, to each of the display apparatus and the external device.

5. The remote control apparatus of claim 4, wherein the communicator communicates with the display apparatus and the external device according to a uniform communication method.

6. The remote control apparatus of claim 4, wherein the controller controls the communicator to transmit a first volume adjusting command corresponding to a first one of the plurality of user commands to a first one of the display apparatus and the external device, and to transmit a second volume adjusting command corresponding to a second one of the plurality of user commands to a second one of the display apparatus and the external device.

7. The remote control apparatus of claim 4, wherein the controller generates a first volume adjusting command according to code information mapped with a first one of the display apparatus and the external device in response to the first user command, and generates a second volume adjusting command according to code information mapped with a second one of the display apparatus and the external device in response to the second user command.

8. A volume control method of a remote control apparatus, comprising:
  receiving a single user command to adjust volume;
  in response to the receiving, generating a plurality of different volume adjusting commands according to information mapped with a type of device to which a volume adjusting command among the plurality of different volume adjusting commands will be transmitted; and
  simultaneously transmitting, the plurality of different volume adjusting commands to a display apparatus and an external device.

9. The volume control method of claim 8, further comprising:
  generating a plurality of volume adjusting commands according to a type of device to which each of the plurality of volume adjusting commands will be transmitted.

10. The volume control method of claim 9, wherein the generating further comprises generating a first volume adjusting command according to code information mapped with the display apparatus and generating a second volume adjusting command according to code information mapped with the external device.

11. A remote control apparatus for controlling volume, comprising:
  a communicator configured to communicate with a display apparatus and an external device;
  an input configured to receive a single user command to adjust volume; and
  a controller configured to, in response to the user command being received, generate a plurality of different volume adjusting commands according to information mapped with a type of device to which a volume adjusting command among the plurality of different volume adjusting commands will be transmitted and, control the communicator to simultaneously transmit the plurality of different volume adjusting commands to both the display apparatus and the external device.

12. The remote control apparatus of claim 11, wherein the communicator communicates with the display apparatus and the external device according to a uniform communication method.

13. The remote control apparatus of claim 11, wherein the controller generates a first volume adjusting command according to code information mapped with the display apparatus, generates a second volume adjusting command according to code information mapped with the external device, and controls the communicator to simultaneously transmit the first volume adjusting command to the display apparatus and the second volume adjusting command to the external device.

14. A volume control method of a multimedia system, comprising:
  in response to each of a plurality of user commands, generating, by a remote control apparatus, a plurality of different volumes adjusting commands according to information mapped with a type of device to which a volume adjusting command among the plurality of different volume adjusting commands will be transmitted;
  alternately transmitting, by the remote control apparatus, the plurality of different volume adjusting commands, to each of a display apparatus and an external device;
  adjusting volume of the display apparatus, by the display apparatus, in response to receiving a first volume adjusting command among the plurality of different volume adjusting commands;
  adjusting volume of the external device, by the external device, in response to receiving a second volume adjusting command different from the first volume adjusting command.

15. A multimedia system, comprising:
  a remote control apparatus configured to, in response to each of a plurality of user commands to adjust volume, generate a plurality of different volumes adjusting commands according to information mapped with a type of device to which a volume adjusting command among the plurality of different volume adjusting commands will be transmitted, and alternately transmit the plurality of different volume adjusting commands; and
  a display apparatus configured to receive a first volume adjusting command, corresponding to a first one of the plurality of user commands to adjust volume, from the remote control apparatus, adjust volume in response to the first volume adjusting command, receive a second volume adjusting command, corresponding to a second one of the plurality of user commands to adjust volume, from the remote control apparatus, and transmit the second volume adjusting command to an external device,
  wherein the external device is configured to receive the second volume adjusting command from the display apparatus, and adjust volume in response to the second volume adjusting command.

16. A volume control method of a multimedia system, comprising:
  generating, in response to a single user command to adjust volume, a plurality of different volume adjusting commands according to information mapped with a type of device to which a volume adjusting command among the plurality of different volume adjusting commands will be transmitted;
  simultaneously transmitting the plurality of different volume adjusting commands to a display apparatus and an external device; and
  adjusting volume of the display apparatus in response to a first volume adjusting command among the plurality of different volume adjusting commands being received, and adjusting volume of the external device in response to a second volume adjusting command among the plurality of different volume adjusting commands being received, the second volume adjusting command being different to the first volume adjusting command.

17. A multimedia system, comprising:
  a remote control apparatus configured to generate a plurality of different volume adjusting commands according to information mapped with a type of device to which a volume adjusting command among the plurality of different volume adjusting commands will be transmitted in response to a single user command to adjust volume being received, and simultaneously transmit the plurality of different volumes adjusting commands to a display apparatus and an external device;
  the display apparatus configured to adjust volume corresponding to a first volume adjusting command, in response to the first volume adjusting command being received; and the external device configured to adjust volume corresponding to a second volume adjusting command, in response to the second volume adjusting command being received.

* * * * *